(12) United States Patent
Schaffer

(10) Patent No.: US 8,487,697 B2
(45) Date of Patent: Jul. 16, 2013

(54) FULLY DIFFERENTIAL AUTOZEROING AMPLIFIER

(75) Inventor: Gregory L. Schaffer, Cupertino, CA (US)

(73) Assignee: Touchstone Semiconductor, Inc., Milpitas, CA (US)

( * ) Notice: Subject to any disclaimer, the term of this patent is extended or adjusted under 35 U.S.C. 154(b) by 95 days.

(21) Appl. No.: 13/315,893

(22) Filed: Dec. 9, 2011

(65) Prior Publication Data

US 2013/0147559 A1 Jun. 13, 2013

(51) Int. Cl.
*H03F 1/02* (2006.01)
(52) U.S. Cl.
USPC .................................................... 330/9
(58) Field of Classification Search
USPC .................... 330/9, 11; 327/124, 307
See application file for complete search history.

(56) References Cited

U.S. PATENT DOCUMENTS 7,274,219 B2 * 9/2007 Pai .................................. 327/51
7,944,287 B2 * 5/2011 Larson et al. ...................... 330/9

OTHER PUBLICATIONS

Musa, F. et al. "A CMOS Monolithic 3 ½-Digit A/D Converter." Solid-State Circuits Conference, Digest of Technical Papers. Feb. 18-20, 1976, vol. XIX, pp. 144-145.

* cited by examiner

*Primary Examiner* — Steven J Mottola
(74) *Attorney, Agent, or Firm* — Gary Stanford

(57) ABSTRACT

A fully differential amplifier with automatic offset voltage zeroing including first and second dynamically switched current mirrors and an output circuit. Each current mirror toggles operation between an autozeroing phase in which it mirrors a first current level indicative of a level of a first input terminal to provide a mirrored current, and an output phase in which it applies a difference current to a common output node. The difference current is a difference between the mirrored current and a second current level indicative of a level of a second input terminal. The first and second dynamically switched current mirrors operate out of phase with respect to each other during respective periods of each cycle of a clock signal. The output circuit develops first and second output signals on first and second output terminals at first and second polarities, respectively, based on a level of the common output node.

20 Claims, 4 Drawing Sheets

US 8,487,697 B2

FULLY DIFFERENTIAL AUTOZEROING AMPLIFIER

FIELD OF THE INVENTION

The present invention relates in general to differential amplifiers, and more particularly to a fully differential, automatic offset voltage zeroing amplifier which is relatively simple to fabricate and which operates at relatively low power.

BACKGROUND OF THE INVENTION

Differential amplifiers are used for many functions, including sensing circuits and the like. For example, differential amplifiers are commonly used for sensing a current level. In a relatively common measurement configuration, a sense resistor is placed in a current path and an amplifier circuit senses voltage across the sense resistor. According to Ohm's law (V=IR), the sensed voltage represents or is otherwise easily converted to another signal which represents the sensed current level.

The implementation of the amplifier circuit depends on the application and system design specifications. The series sense resistor usually has a relatively small resistance, such as less than 1 Ohm ($\Omega$) (e.g., 10-100 milliohms (m$\Omega$) or the like), to avoid significant impact on the current being measured. Thus, the amplifier circuit is usually configured with a relatively high gain to ensure relatively accurate measurement.

Many different amplifier circuit implementations have been used to sense the voltage developed across the sense resistor. The amplifier circuit is usually designed to amplify a very small sense voltage in the presence of relatively large common-mode voltages. DC precision (low input offset voltage) and high common-mode rejection ratio (CMRR) are distinguishing characteristics of the op amps used within amplifier circuits.

It is often desired to measure current in both directions so that a bidirectional amplifier circuit is used. One common bidirectional configuration is to use a pair of amplifiers (e.g., operational amplifiers) in a dual configuration in which a first amplifier senses current in one direction and a second amplifier senses current in the opposite direction. In certain applications, however, it may be desired to minimize the size and cost of circuitry and power consumption. A dual amplifier solution typically increases cost, size and power consumption, and each individual amplifier usually has a voltage offset. The dual amplifier solution should be designed to ensure that only one amplifier is on at any given time to prevent erroneous output or even circuit failure. This presents a design challenge at the low level or zero-crossing point, since the dual configuration is usually configured with a voltage gap thus reducing overall accuracy.

Single amplifier implementations are known. Such implementations are either complicated, expensive, power consuming, etc. For example, the power must usually be increased to increase bandwidth (speed of response), and complicated amplifier topology along with filtering circuitry is usually added to minimize offset voltage. It is desired to provide a simple, low power solution which minimizes offset voltage to improve accuracy.

BRIEF SUMMARY OF INVENTION

A fully differential amplifier with automatic offset voltage zeroing according to one embodiment includes first and second dynamically switched current mirrors and an output circuit. Each dynamically switched current mirror toggles operation between an autozeroing phase in which it mirrors a first current level indicative of a level of a first input terminal to provide a mirrored current, and an output phase in which it applies a difference current to a common output node. The difference current is a difference between the mirrored current and a second current level indicative of level of a second input terminal. The first and second dynamically switched current mirrors operate out of phase with respect to each other during respective periods of each cycle of a clock signal. The output circuit develops first and second output signals on first and second output terminals at first and second polarities, respectively, based on a level of the common output node.

An output limiter may be included which limits both of the first and second output terminals when both are active at the same time. A separator may be provided which causes a more active one of the first and second output terminals to turn off the other one when the first and second output terminals are relatively close to each other.

A bidirectional current sense amplifier for measuring a sense current flowing through a sense resistor according to one embodiment includes first and second sense nodes for coupling across the sense resistor, a first gain resistor having a first end coupled to the first sense node and having a second end for coupling to a first differential sense node, a second gain resistor having a first end coupled to the second sense node and having a second end for coupling to a second differential sense node, a first transistor having current terminals coupled between the first differential sense node and an output node and having a control node coupled to a first differential output node, a second transistor having current terminals coupled between the second differential sense node and the output node and having a control node coupled to a second differential output node, an output resistor coupled between the output node and a common reference node, and an autozeroing fully differential amplifier having first and second input terminals coupled to the first and second differential sense nodes, respectively, and having first and second output terminals coupled to the first and second differential output nodes, respectively.

The bidirectional current sense amplifier may be implemented as a composite amplifier in which it further includes a main differential amplifier having first and second input terminals coupled to the first and second differential input nodes, respectively, and having first and second output terminals coupled to the first and second differential output nodes, respectively. A high frequency filter and supply circuitry may be provided in the composite configuration.

A method of amplifying a differential input at first and second terminals to provide a differential output at first and second output terminals while automatically zeroing offset voltage according to one embodiment includes generating a first current at a level indicative of a level of the first input terminal, and mirroring the first current as a first mirror current while generating and storing a first charge during a first period of a first cycle of a clock signal having first and second periods for each cycle, and during the second period of the first cycle of the clock signal, maintaining the first mirror current using the stored first charge, generating a second current at a level indicative of a level of the second input terminal, and subtracting the second current from the first mirror current and providing a first difference current to a common node, and developing a first output signal for the first output terminal at a first polarity based on a level of the common node, and developing a second output signal for the second output terminal at a second polarity based on the level of the common node.

The method may include providing a second mirror current using a stored second charge, generating a third current at a level indicative of a level of the second input terminal, and subtracting the third current from the second mirror current and providing a second difference current to the common node during the first period of the first cycle of the clock signal, and during the second period of the first cycle of the clock signal, generating a fourth current at a level indicative of a level of the first input terminal, and mirroring the fourth current as a third mirror current while generating and storing a third charge.

The method may further include limiting both of the first and second output terminals when both are active at the same time. The method may further include separating the first and second output terminals by turning off the less active output terminal when the first and second output terminals are relatively close to each other.

BRIEF DESCRIPTION OF THE DRAWINGS

The benefits, features, and advantages of the present invention will become better understood with regard to the following description, and accompanying drawings where.

DETAILED DESCRIPTION OF THE INVENTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
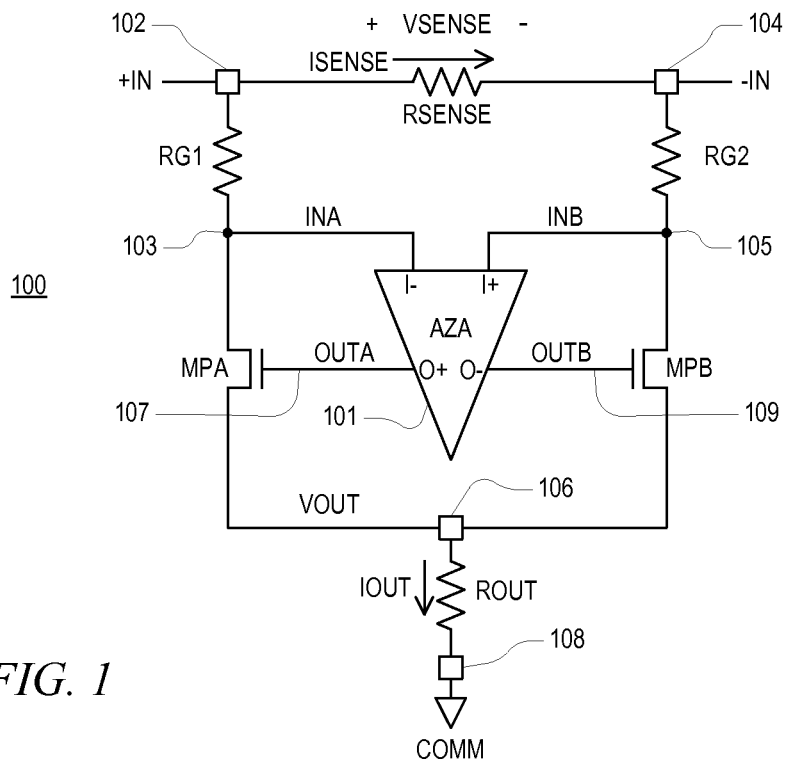
FIG. 1 is a schematic diagram of a bidirectional current sense amplifier using a fully differential automatic zeroing amplifier (AZA) implemented according to one embodiment of the present invention.

FIG. 1 is a schematic diagram of a bidirectional current sense amplifier 100 using a fully differential automatic zeroing (or "autozeroing") amplifier (AZA) 101 implemented according to one embodiment of the present invention. The current sense amplifier 100 includes a sense resistor RSENSE coupled between a pair of input nodes 102 and 104 for sensing a current ISENSE. The current ISENSE flowing through the resistor RSENSE develops a sense voltage VSENSE. The input nodes 102 and 104 are shown developing a positive input signal +IN and a negative input signal −IN, respectively.

A first gain resistor RG1 has one end coupled to input node 102 (+IN) and another end coupled to a node 103 developing an amplifier input voltage INA. Node 103 is further coupled to an inverting or negative input terminal (I−) of the AZA 101 and to a current terminal of a transistor MPA. MPA has another current terminal coupled to an output node 106 developing an output voltage VOUT. MPA has a control terminal coupled to a non-inverting or positive output terminal (O+) of the AZA 101 at a node 107 developing an amplifier output signal OUTA. A second gain resistor RG2 has one end coupled to the other input node 104 (−IN) and another end coupled to a node 105 developing another amplifier input voltage INB. Node 105 is further coupled to a non-inverting or positive input terminal (I+) of the AZA 101 and to a current terminal of another transistor MPB. MPB has another current terminal coupled to the output node 106. MPB has a control terminal coupled to an inverting or negative output terminal (O−) of the AZA 101 at a node 109 developing an amplifier output signal OUTB.

Output node 106 is coupled to one end of an output resistor ROUT, which has its other end coupled to a node 108, which is further coupled to a common node having a common voltage level COMM. COMM has a common or reference voltage level, which may be any suitable positive, negative or ground voltage level. An output current IOUT is shown flowing through ROUT for developing the output voltage VOUT. The current ISENSE flows through RSENSE developing the sense voltage VSENSE. The AZA 101 senses VSENSE via RG1 and RG2 at its inputs and develops its outputs OUTA and OUTB to drive the output current IOUT through ROUT. The output voltage VOUT has a voltage level indicative of ISENSE.

In one embodiment, the AZA 101 is implemented on an integrated circuit (IC) or semiconductor chip or the like. The gain resistors RG1 and RG1 and the transistors MPA and MPB may also be provided on the same IC, in which case the input nodes 102 and 104 and the output node 106 are configured as input, output or input/output (I/O) ports or pins of the IC. The sense resistor RSENSE may be implemented on the IC, but may also be off-chip to enable a circuit designer to select a suitable value for RSENSE. The output resistor ROUT may also be implemented within the chip or provided externally. As shown, for example, node 108 may also be implemented as a ground pin of the IC for coupling to COMM.

In one embodiment, the IC is manufactured using complementary metal-oxide semiconductor (CMOS) technology. Many modern electronic devices are implemented using CMOS technology for reduced size and power consumption. CMOS technology, for example, is particularly advantageous for smaller and/or lower power electronic devices including those which are powered by a battery. Although bipolar devices may be integrated along with CMOS devices on a common chip (e.g., BiCMOS or BiMOS), it is preferred to implement as many devices and components as possible using the same process because it is generally easier, less expensive, and more efficient.

In the illustrated embodiment, the transistors MPA and MPB are implemented using P-type or P-channel MOS transistors (or PMOS transistors). An alternative configuration may be implemented using N-type or N-channel MOS transistors (or NMOS transistors) or the like. In a MOS configuration, including CMOS, the current terminals of the transistors MPA and MPB are referred to as drain and source terminals and the control terminals are referred to as gate terminals.

The input signal for the bidirectional current sense amplifier 100 is the current ISENSE flowing through the sense resistor RSENSE. The resistor RSENSE develops a voltage VSENSE. The gain resistors RG1 and RG2 are assumed to have resistances of RG1 and RG2, respectively. When the AZA 101 is an ideal amplifier, the input offset voltage is zero which forces INA to be equal to INB. If VSENSE is positive, a signal current VSENSE/RG1 flows through RG1 and MPA to IOUT. If VSENSE is negative (ISENSE is negative), then a current −VSENSE/RG2 flows through RG2 and MPB to IOUT. If the resistances RG1 and RG2 are equal, then the gain is substantially the same in both directions.

As an example, assume RSENSE is 0.05Ω, RG1 and RG1 are both 100Ω, ROUT is 10 kilo-ohms (KΩ), and ISENSE is 0.5 Amperes (A) (in which the values are approximations). VSENSE=ISENSE*RSENSE=25 milli-Volts (mV). A current of VSENSE/RG1=250 micro-Amperes (μA) flows through RG1. The AZA 101 operates to drive OUTA and OUTB to the appropriate levels to maintain INA equal to INB. Thus, OUTA is active and goes to a negative level to turn on MPA by the appropriate amount so that the same current through RG1 flows through MPA. OUTB is inactive and goes positive to turn off MPB. In this manner, the current through RG1 flows through MPA and ROUT as IOUT, so that VOUT=250 μA*10 KΩ=2.5V. If ISENSE is reversed so that it is −0.5 A, then a current of 250 μA flows through RG2, MPB and ROUT so that VOUT=2.5V.

Figure 2:
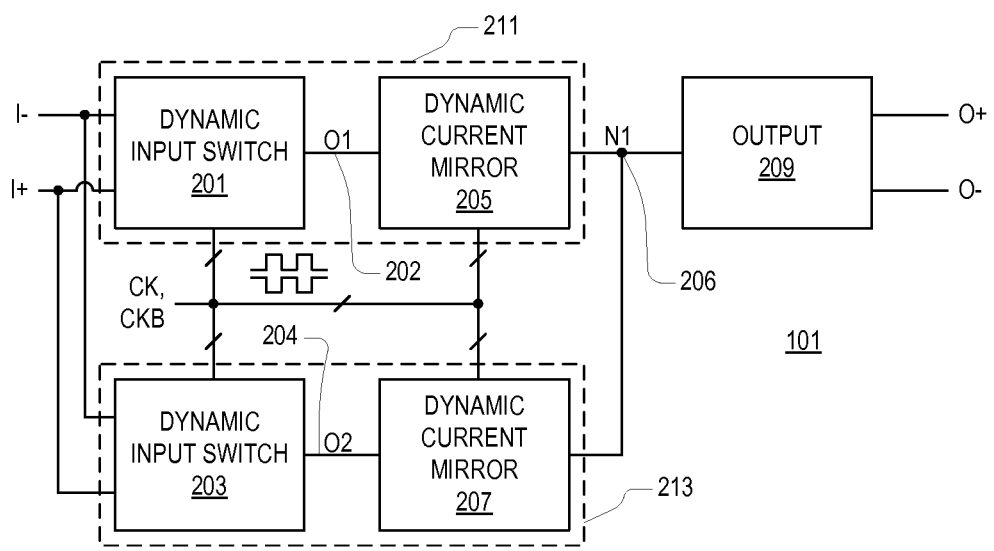
FIG. 2 is a simplified block diagram of an exemplary embodiment of the AZA of FIG. 1.

FIG. 2 is a simplified block diagram of an exemplary embodiment of the AZA 101. The positive and negative input terminals I− and I+ are both provided to respective inputs of two dynamic input switches 201 and 203. The dynamic input switch 201 provides an output signal O1 on node 202 to an input of a first dynamic current mirror 205 and the dynamic input switch 203 provides an output signal O2 on node 204 to an input of a second dynamic current mirror 207. The outputs of the dynamic current mirrors 205 and 207 are coupled together at node 206 developing a signal N1, which is provided to an input of an output block 209. The output block 209 develops output signals provided on the output terminals O+ and O−.

The input switches 201 and 203 and the current mirrors 205 and 207 are "dynamic" in that they are responsive to a pair of complementary clock signals CK and CKB. The clock signal CKB is a complementary version of CK in that when CK goes high, CKB goes low and vice-versa. The clock signals CK and CKB may be derived from a single master clock signal since they are inverted with respect to each other. As further described herein, the input switch 201 is coupled to input terminal I− during a first period of the CK/CKB clock signals in which O1 develops a level indicative of a voltage of I− during the first clock period. The input switch 201 then switches to the other input terminal I+ during a second period of the CK/CKB clock signals in which O1 develops a level indicative of a difference between the voltages of I+ and I− during the second clock period. The input switch 203 operates in similar and opposite manner. In particular, the input switch 203 is coupled to I+ during the first clock period in which O2 develops a level indicative of a difference between the voltages of I+ and I− during the first period, and then the input switch 203 is coupled to I− during the second clock period in which O2 develops a level indicative of a voltage of I− during the second clock period.

In the first clock period, the dynamic current mirror 205 is isolated from N1 and is responsive to O1 to develop and effectively store a charge representing the level of I−. In the second clock period, the dynamic current mirror 205 drives the N1 signal at a level proportional to a difference between the input terminals I− and I+ at a selected gain level. The dynamic current mirror 207 operates in similar manner as the dynamic current mirror 205 except that the two current mirrors operate out of phase. In particular, in the second clock period, the dynamic current mirror 207 is isolated from N1, and further is responsive to O2 to develop and effectively store a charge representing the level of I− (or INA with reference to FIG. 1). In the first clock period, the dynamic current mirror 207 drives the N1 signal at a level proportional to a difference between the input terminals I− and I+ at a selected gain level.

The dynamic input switch 201 and the dynamic current mirror 205 are collectively referred to as a first dynamically switched current mirror 211. The dynamic input switch 203 and the dynamic current mirror 207 are collectively referred to as a second dynamically switched current mirror 213.

Figure 3:
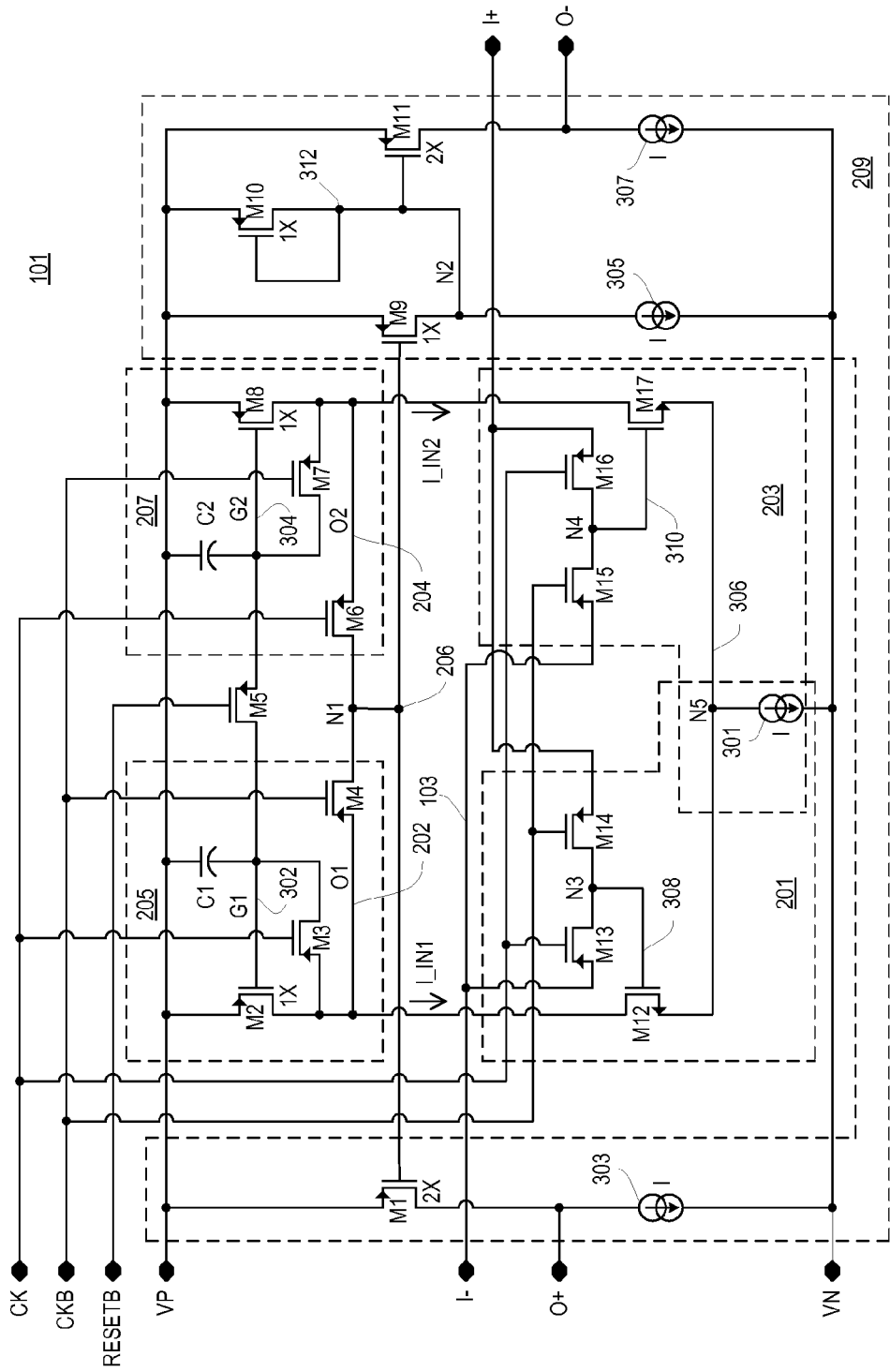
FIG. 3 is a more detailed schematic diagram of the AZA of FIG. 1 according to one embodiment.

FIG. 3 is a more detailed schematic diagram of the AZA 101 according to one embodiment. The input switch 201 includes an N-type transistor M12, P-type transistors M13 and M14 and a current source 301, and the input switch 203 includes an N-type transistor M17, P-type transistors M15 and M16 and the current source 301. The current source 301 is a common bias current device for both input switches 201 and 203 and develops a common bias current I. The current mirror 205 includes P-type transistors M2, M3 and M4 and capacitor C1, and the current mirror 207 includes P-type transistors M6, M7 and M8 and capacitor C2. Output block 209 includes P-type transistors M1, M9, M10 and M11 and current sources 303, 305 and 307. The current sources each operate as bias current devices developing the common bias current I. In one embodiment, the P-type transistors are PMOS transistors or devices and the N-type transistors are NMOS transistors as understood by those of ordinary skill in the art. Alternative devices are contemplated in alternative configurations which have substantially similar functionality.

For the dynamic current mirror 205, M2 has its source coupled to a positive supply voltage VP, its drain coupled to node 202 and its gate coupled to a node 302 developing a gate signal G1. M3 has its source coupled to node 202, its drain coupled to node 302 and its gate receiving the clock signal CK. M4 has its source coupled to node 202, its drain coupled to node 206, and its gate receiving clock signal CKB. The capacitor C1 is coupled between VP and node 302. In a similar manner for the current mirror 207, M8 has its source coupled to VP, its drain coupled to node 204 and its gate coupled to a node 304 developing a gate signal G2. M7 has its source coupled to node 204, its drain coupled to node 304 and its gate receiving the clock signal CKB. M6 has its source coupled to node 204, its drain coupled to node 206, and its gate receiving clock signal CK. The capacitor C2 is coupled between VP and node 304. The current mirrors 205 and 207 are implemented in a symmetric manner yet are controlled out of phase with respect to each other by the clock signals CK and CKB as further described herein. A P-type transistor M5 has its drain coupled to node 302, its source coupled to node 304, and its gate receiving a reset signal RESETB.

For the input switch 201, M12 has its drain coupled to node 202 (O1), its source coupled to a node 306 developing a signal N5, and its gate coupled to a node 308 developing a signal N3. The current source 301 is coupled between node 306 and a negative supply voltage VN and sinks the current I from signal N5 to VN. M13 has its source coupled to the negative input terminal I−, its drain coupled to node 308, and its gate receiving clock signal CK. M14 has its source coupled to the positive input terminal I+, its drain coupled to node 308, and its gate receiving clock signal CKB. In a similar manner for the input switch 203, M17 has its drain coupled to node 204 (O2), its source coupled to node 306, and its gate coupled to a node 310 developing a signal N4. M16 has its source coupled to the positive input terminal I+, its drain coupled to node 310, and its gate receiving clock signal CK. M15 has its source coupled to the negative input terminal I−, its drain coupled to node 310, and its gate receiving clock signal CKB.

The input switches 201 and 203 are implemented in a symmetric manner yet are oppositely controlled with respect to each other by the clock signals CK and CKB as further described herein.

For the output block 209, M1 has its source coupled to VP, its drain coupled to the positive output terminal O+, and its gate coupled to node 206 (N1). The current source 303 is coupled between output terminal O+ and VN and sinks current I from O+ to VN. M9 has its source coupled to VP, its drain coupled to a node 312 developing a signal N2, and its gate coupled to node 206 (N1). M10 has its source coupled to VP, and its gate and drain coupled together at node 312. M11 has its source coupled to VP, its gate coupled to node 312, and its drain coupled to the negative output terminal O−. The current source 305 is coupled between node 312 and VN and sinks current I from N2 to VN. The current source 307 is coupled between output terminal O− and VN and sinks current I from O− to VN.

The dynamic input switch 201 and the dynamic current mirror 205 are implemented in a symmetric manner with respect to the dynamic input switch 203 and the dynamic current mirror 207. I− and I+ are two differential input terminals and O+ and O− are the corresponding differential output terminals. M9 is positioned in a symmetric manner with respect to M1 within the output block 209. However, M10 and M11 are provided to reverse the polarity of O− with respect to O+. The output terminals O+ and O− are out of phase with respect to the input terminals I− and I+. In particular, as I− goes positive with respect to I+, O+ goes negative. Similarly, as I+ goes positive with respect to I−, O− goes negative. Again, the dynamic input switch 201 and the dynamic current mirror 205 are collectively referred to as the first dynamically switched current mirror 211, and the dynamic input switch 203 and the dynamic current mirror 207 are collectively referred to as the second dynamically switched current mirror 213 (as shown in FIG. 2).

Operation of the AZA 101 is now described with reference to FIG. 3. RESETB is assumed to be high during normal operation so that M5 is off. When CK is low and CKB is high, M13 is turned on and M14 is turned off within the input switch 201, which couples input terminal I− to the gate of M12 through M13. M12, which generally remains biased on by the current source 301, develops the current level of I_IN1 based on the voltage level applied to I−. Within the current mirror 205, M4 is turned off effectively isolating the current mirror 205 from node N1. M3 is turned on which couples the nodes 302 (G1) and 202 (O1) together. The voltage of the capacitor C1 stabilizes when the drain current of M2 substantially equals the current I_IN1, so that the drain current of M2 effectively mirrors the I_IN1 indicative of the voltage level applied to the input terminal I−. In this manner, the charge on C1 represents the level of I− and causes the drain of M2 to mirror the current I_IN1 indicative of I−. This is referred to as the autozeroing (AZ) phase of the first dynamically switched current mirror 211.

The clock signals CK and CKB change polarity so that M3 and M13 are turned off while M4 and M14 are both turned on. M4 couples node 202 (O1) to node 206 (N1) and M14 couples node 308 (N3) to I+. The gate voltage of M2 is kept constant by the charge stored on the capacitor C1 during the clock polarity switching, so that the drain current of M2 remains substantially unchanged. The gate of M12, however, is switched to be coupled instead to the positive input terminal I+. If I+ is different from I−, then the drain current of M12 changes and thus changes the current I_IN1 to a level based on the voltage level of I+. The difference between the drain current of M2 (indicative of the voltage of I−) and the drain current of M12 (I_IN1, which is now indicative of the voltage of I+) flows from node 202 (O1) to node 206 (N1), which results in a signal (or voltage level) at N1 which is proportional to the difference between the input terminals I− and I+ gained up by the two transistor amplifier formed by M2 and M12. This is referred to as the output phase of the first dynamically switched current mirror 211. Node 202 (O1) operates as a current difference node in which the difference between the drain currents of M2 and M12 is provided to node 206 (N1).

The second dynamically switched current mirror 213 operates in substantially similar manner including an AZ phase when CK is high (and CKB is low) and an output phase when CK is low (and CKB is high). When the second dynamically switched current mirror 213 is in its AZ phase, the drain current of M8 stabilizes at a level indicative of the voltage level applied to I−. In this manner, the charge on C2 represents the level of I− and causes the drain of M8 to mirror the current I_IN2 indicative of I−. When the second dynamically switched current mirror 213 is in its output phase, the difference between the drain current of M8 (indicative of the voltage of I−) and the drain current of M17 (I_IN2, which is now indicative of the voltage of I+) flows from node 204 (O2) to node 206 (N1), which results in a signal at N1 which is proportional to the difference between the input terminals I− and I+ gained up by the two transistor amplifier formed by M8 and M17. Node 204 (O2) also operates as a current difference node in which the difference between the drain currents of M8 and M17 is provided to node 206 (N1).

The second dynamically switched current mirror 213 operates out of phase with respect to the first dynamically switched current mirror 211. Thus, when the first dynamically switched current mirror 211 is in its AZ phase, the second dynamically switched current mirror 213 is in its output phase, and vice-versa. Thus, while one is autozeroing with respect to input terminal I−, the other is measuring the voltage of I+ and providing a signal at N1 which is proportional to the difference between the input terminals I− and I+ at a corresponding dual transistor gain. In this manner, a differential input signal (e.g., INA−INB) applied to the input terminals I− and I+ is continuously being monitored to develop the output.

The signal N1 on node 206 drives the gates of M1 and M9. In the illustrated embodiment, M9 operates at about one-half (½) the current of M1. In the illustrated embodiment shown in FIG. 3, the notations "1X" and "2X", if shown adjacent to a transistor, denote a relative number of individual transistors coupled in parallel although collectively illustrated as a single device. Two substantially similar transistors coupled in parallel effectively doubles the current capacity of a single transistor. Alternatively, these notations may represent a relative size of the transistors having substantially the same doubling effect of current. In this manner, M1 and M9 track each other. M1 supplies the output signal on the output terminal O+, and the output of M9 is inverted by M10 and M11 so that the output terminal O− is inverted with respect to the output terminal O+. Since M9 and M10 have common drains, their total drain current is substantially equal to that of the current I of the current source 305. Under balanced conditions (e.g., I−=I+), M9 and M10 should have substantially equal drain currents. M11 controls the signal of the output terminal O−. If I− is not equal to I+, then the drain currents of M9 and M10 do not match although the sum of the currents through M9 and M10 substantially equal the bias current I of the current source 305. In this manner, if the drain current of M9 increases, then the drain current of M10 decreases by the same amount and vice-versa. Since M11 mirrors the drain current of M10 at twice the current level, M11 has twice the output current of M10. Thus, the drain currents of M1 and M11 are out of phase but develop approximately the same signal current.

It is noted that the output stages of the output block 209 are current output stages or "gm" (transconductance) stages. In particular, the voltage of N1 is applied to the gates of M1 and M9 changing their drain currents, which changes the output currents. Without a load on output terminals O+ or O−, the output stages have relatively large voltage gains. Combined with the voltage gain of the dynamic current mirrors 205 and 207, the overall voltage gain can be significant. In one embodiment, for example, the voltage gain can be over 100 decibels (dB).

As previously noted, M5 is turned off during normal operation. M5 may be turned on during power up or when the clock signals CK and CKB are inactive so that no switching takes place. When M5 is turned on by pulling RESETB low, G1 and G2 are connected together and one of the dynamically switched current mirrors 211, 213 is in its AZ mode. In that case, G1 and G2 are at the same voltage level determined by the voltage of I−. The other dynamically switched current mirror is coupled to the input terminal I+ and its output is coupled to node 206 (N1). In this configuration (when M5 is on), the AZA 101 operates as a non-switching (static) differential amplifier which may have a relatively high offset voltage. This is because only one of the dynamically switched current mirrors is "autozeroed" (as a result of autozeroing) and the other current mirror is unlikely to have the same autozeroed voltage, which results in an input offset voltage. Nonetheless, the static amplifier configuration still operates as a differential amplifier.

When CK and CKB are toggling to opposite states and M5 is turned off during normal operation, both of the dynamic current mirrors 205 and 207 are alternately autozeroed to the gate source voltage that gives a drain current substantially identical to that of the input transistors drain current while coupled to the input terminal I−.

It is noted that the clock connections of M13, M14, M15 and M16 (M13-M16) may be reversed, which reverses the phase of the input/output pairs. In the illustrated configuration shown in FIG. 3, when I− is positive with respect to I+, then O+ goes negative while O− goes positive. Reversing the clock signals to M13-M16 causes O+ to go positive and O− to go negative when I− goes positive with respect to I+.

Figure 4:
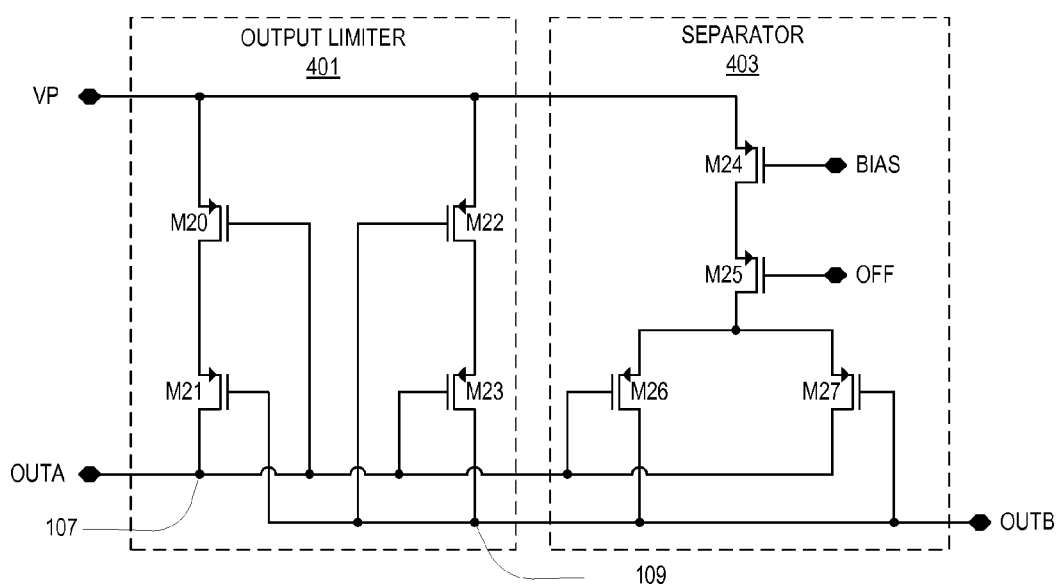
FIG. 4 is a schematic diagram of an output limiter and a separator used with the AZA of FIG. 1 according to an exemplary embodiment.

FIG. 4 is a schematic diagram of an output limiter 401 and a separator 403 according to an exemplary embodiment. Referring back to FIG. 1, it is noted that only one of the transistors MPA and MPB should be on at any given time. Thus, it is desired that only one of the output signal OUTA or OUTB should be active at any given time. Otherwise, both transistors MPA and MPB are on simultaneously with INA=INB, but with an undeterminable current flowing through MPA and MPB. The output limiter 401 and the separator 403 collectively prevent undesirable conditions which potentially lead to undesirable results. The output limiter 401 and the separator 403 may be implemented within the AZA 101 or external to the AZA 101.

The output limiter 401 includes P-type transistors M20, M21, M22 and M23. The sources of M20 and M22 are coupled to VP. The drain of M20 is coupled to the source of M21 and the drain of M22 is coupled to the source of M23. The drain of M21 is coupled to node 107 (OUTA) and the drain of M23 is coupled to node 109 (OUTB). The gates of M20 and M23 are both coupled to receive OUTA and the gates of M21 and M22 are both coupled to receive OUTB. M20 and M21 collectively operate to clamp OUTA, whereas M22 and M23 collectively operate to clamp OUTB. Thus, if both OUTA and OUTB are active such that MPA and MPB are both on (e.g., both outputs go negative), then current flows through the transistors M20-M23 thereby limiting the output swing of OUTA and OUTB. This, in turn, limits the output current IOUT of the bidirectional current sense amplifier 100. The output limiter 401 prevents large output currents from flowing when the AZA 101 is powering on but not yet stabilized.

The separator 403 includes P-type transistors M24, M25, M26 and M27. The source of M24 is coupled to VP and its drain is coupled to the source of M25. The drain of M25 is coupled to the sources of both M26 and M27. The drain of M26 is coupled to OUTB and the drain of M27 is coupled to OUTA. The gate of M24 receives a bias voltage BIAS. The gate of M25 receives a voltage OFF. The gate of M26 is coupled to OUTA and the gate of M27 is coupled to OUTB.

During power on or reset (POR), the output limiter 401 operates to clamp the output swings. The OFF signal is asserted high during POR to turn off M25 so that the separator is inoperative. When the circuit stabilizes after power up, OFF is pulled to VN (or otherwise pulled low) so that M25 is turned on to activate the separator 403. The signal current is set by a voltage level of BIAS so that M24 has a current level which is proportional to the operating current of the AZA 101. In one embodiment, this current is about one-fourth (¼) of the output stage quiescent current level, which results in a hysteresis function referred to the input. The separator 403 is configured as a relatively simple comparator with hysteresis. If the OUTA and OUTB signals are relatively close to each other, then the more negative of the two turns off the other. The separator 403 thus prevents problems at low signal levels, such as when VSENSE changes polarity. For example, when OUTA is slightly more negative than OUTB, the drain current of M26 is greater than the drain current of M27 so that OUTB is pulled more positive. OUTB going more positive tends to turn off MPB while also turning off current that may be flowing into output node 107 driving MPA.

Figure 5:
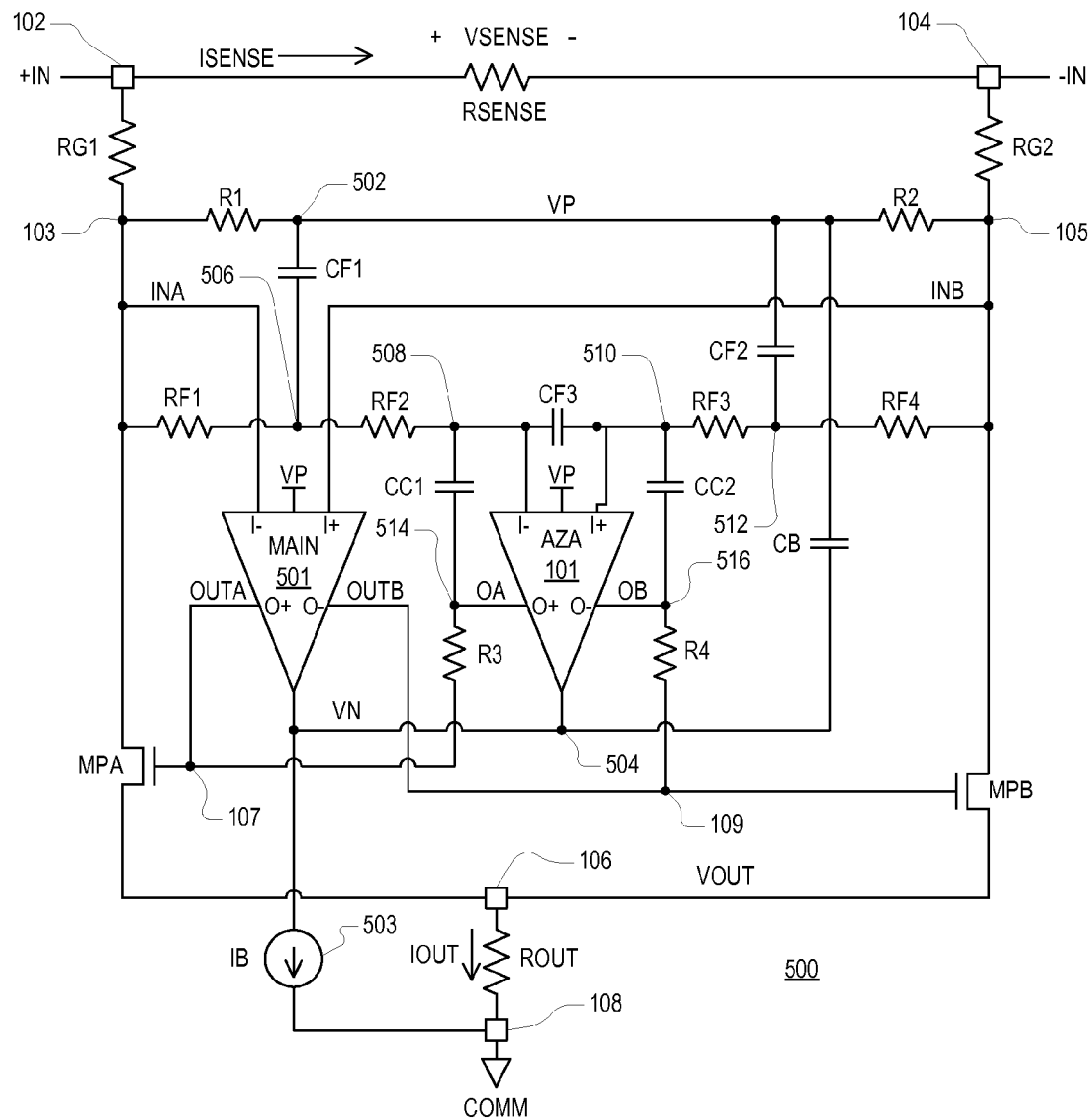
FIG. 5 is a schematic diagram of another bidirectional current sense amplifier implemented according to a composite configuration using the AZA of FIG. 1 coupled substantially in parallel with a main fully differential amplifier.

FIG. 5 is a schematic diagram of another bidirectional current sense amplifier 500 implemented according to a composite configuration using the AZA 101. The bidirectional current sense amplifier 500 includes similar components as the bidirectional current sense amplifier 100 in which similar components assume identical reference numerals. In a similar manner as previously described, the sense resistor RSENSE is coupled between input nodes 102 (+IN) and 104 (−IN) for sensing a current ISENSE and which develops the sense voltage VSENSE. RG1 is coupled between nodes 102 and 103 (INA) and RG2 is coupled between nodes 104 and 105 (INB). MPA has its current terminals coupled between node 103 and output node 106 (VOUT) and MPB has its current terminals coupled between nodes 105 and 106. Output resistor ROUT is coupled between nodes 106 and 108 in which node 108 is coupled to COMM, so that the output current IOUT flows through ROUT to develop the output voltage VOUT.

For the bidirectional current sense amplifier 500, AZA 101 is replaced as the primary amplifier by a main amplifier 501. The main amplifier 501 has input terminals I− and I+ coupled to receive INA and INB, respectively, and has output terminals O+ and O− coupled to provide output signals OUTA and OUTB, respectively, to the gates of MPA and MPB, respectively. The main amplifier 501 may be configured with a higher bandwidth than the AZA 101 to provide a faster dynamic response to changes of ISENSE. The main amplifier 501, however, typically has a relatively significant input offset voltage which reduces accuracy. The AZA 101 is effectively coupled in parallel with the main amplifier 501 along with additional supporting circuitry as further described herein.

A first supply resistor R1 is coupled between node 103 and a node 502 and a second supply resistor R2 is coupled between node 502 and node 105. R1 and R2 are relatively large resistors having approximately the same resistance (e.g., matched resistors) so that node 502 develops a positive power supply voltage VP which is at a midpoint voltage level between nodes 103 and 105. VP is coupled to the positive power supply inputs of both the AZA 101 and the main amplifier 501. Node 502 is coupled to the positive power supply inputs of both the AZA 101 and the main amplifier 501. A bypass capacitor CB has one end coupled to node 502 and another end coupled to node 504 which develops a negative power supply voltage VN coupled to the negative power supply inputs of both the AZA 101 and the main amplifier 501. A current source 503 is coupled between node 504 (VN) and COMM and operates to sink a bias current level IB from VN to COMM. A high frequency filter is provided including resistors RF1, RF2, RF3, RF4 and capacitors CF1, CF2 and CF3. RF1 is coupled between nodes 103 and 506, RF2 is coupled between nodes 506 and 508, CF3 is coupled between nodes 508 and 510, RF3 is coupled between nodes 510 and 512, and RF4 is coupled between nodes 512 and 105. CF1 is couple between nodes 502 and 506 and CF2 is coupled between nodes 502 and 512. The input terminals I− and I+ of AZA 101 are coupled to nodes 508 and 510, respectively. A first compensation capacitor CC1 is coupled between nodes 508 and 514 and a second compensation capacitor CC2 is coupled between nodes 510 and 516. The positive output terminal O+ of the AZA 101 is coupled to node 514 which develops an output signal OA, and the negative output terminal O− of the AZA 101 is coupled to node 516 which develops an output signal OB. A first coupling resistor R3 is coupled between nodes 514 and 107 and a second coupling resistor R4 is coupled between nodes 516 and 109.

As illustrated in FIG. 5, bidirectional current sense amplifier 500 is a composite configuration including both the AZA 101 and the main amplifier 501. Both amplifiers 101 and 501 are configured as transconductance type amplifiers with voltage inputs and current outputs to enable them to be coupled in parallel. One significant advantage of the composite configuration as compared to the AZA 101 operating alone is that the main amplifier 501 provides faster dynamic response. Another significant advantage of the composite configuration as compared to the main amplifier 501 operating alone is that the AZA 101 performs the autozeroing function to compensate for and minimize the input offset voltage of the main amplifier 501. The AZA 101 also substantially reduces low frequency noise of both amplifiers.

While various embodiments of the present invention have been described herein, it should be understood that they have been presented by way of example, and not limitation. It will be apparent to persons skilled in the relevant arts that various changes in form and detail can be made therein without departing from the scope of the invention. Finally, those skilled in the art should appreciate that they can readily use the disclosed conception and specific embodiments as a basis for designing or modifying other structures for carrying out the same purposes of the present invention without departing from the scope of the invention as defined by the appended claims.

The invention claimed is:

1. A fully differential amplifier with automatic offset voltage zeroing, comprising:

first and second dynamically switched current mirrors, each toggling operation between an autozeroing phase in which it mirrors a first current level indicative of a level of a first input terminal to provide a mirrored current, and an output phase in which it applies a difference current to a common output node, wherein said difference current comprises a difference between said mirrored current and a second current level indicative of level of a second input terminal;

wherein said first and second dynamically switched current mirrors operate out of phase with respect to each other during at least one cycle of a clock signal having a first period and a second period, wherein said first dynamically switched current mirror operates in its autozeroing phase while said second dynamically switched current mirror operates in its output phase during said first period, and wherein said second dynamically switched current mirror operates in its autozeroing phase while said first dynamically switched current mirror operates in its output phase during said second period; and an output circuit which develops a first output signal on a first output terminal at a first polarity based on a level of said common output node, and which develops a second output signal on a second output terminal at a second polarity based on a level of said common output node.

2. The fully differential amplifier of claim 1, wherein each of said first and second dynamically switched current mirrors comprises:

a current difference node;

a dynamic current mirror, comprising:

a first transistor having a first current terminal coupled to a first supply node, having a second current terminal coupled to said current difference node, and having a control terminal;

a second transistor having a first current terminal coupled to said current difference node, having a second current terminal coupled to said control terminal of said first transistor, and having a control terminal receiving said clock signal;

a capacitor coupled between said first supply node and said control terminal of said first transistor; and a third transistor having a first current terminal coupled to said current difference node, having a second current terminal coupled to said common output node, and having a control terminal receiving an inverted clock signal comprising an inverted version of said clock signal; and a dynamic input switch, comprising:

a fourth transistor having a first current terminal coupled to said current difference node, having a second current terminal coupled to a common bias node developing a bias signal relative to a second supply node, and having a control terminal;

a fifth transistor having a first current terminal coupled to said first input terminal, having a second current terminal coupled to an input reference node, and having a control terminal receiving a selected one of said clock signal and said inverted clock signal; and a sixth transistor having a first current terminal coupled to said second input terminal, having a second current terminal coupled to said input reference node, and having a control terminal receiving the other one of said selected one of said clock signal and said inverted clock signal.

3. The fully differential amplifier of claim 2, further comprising a current source which generates a bias current and which is coupled between said common bias node and said second supply node.

4. The fully differential amplifier of claim 2, wherein said first, second, third, fifth and sixth transistors each comprise a PMOS transistor and wherein said fourth transistor comprises an NMOS transistor.

5. The fully differential amplifier of claim 1, wherein said output circuit comprises:
 a first transistor having a first current terminal coupled to a first supply node, having a second current terminal coupled to said first output terminal, and having a control terminal coupled to said common output node;
 a first current source coupled between said first output terminal and a second supply node, wherein said first current source provides a first bias current;
 a second transistor having a first current terminal coupled to said first supply node, having a second current terminal, and having a control terminal coupled to said common output node;
 a second current source coupled between said second current terminal of said second transistor and said second supply node, wherein said second current source provides a second bias current;
 a third transistor having a first current terminal coupled to said first supply node, having a second current terminal and having a control terminal both coupled to said second current terminal of said second transistor;
 a fourth transistor having a first current terminal coupled to said first supply node, having a second current terminal coupled to said second output terminal, and having a control terminal coupled to said second current terminal of said second transistor; and
 a third current source coupled between said second output terminal and said second supply node, wherein said third current source provides a third bias current.

6. The fully differential amplifier of claim 5, wherein said first, second, third and fourth transistors each comprise a PMOS transistor.

7. The fully differential amplifier of claim 1, further comprising:
 an output limiter which limits both of said first and second output terminals when both are active at the same time; and
 a separator which causes a more active one of said first and second output terminals to turn off the other one when a level of said first and second output terminals are relatively close to each other.

8. The fully differential amplifier of claim 7, wherein said output limiter comprises:
 a first transistor having a first current terminal coupled to a first supply node, having a second current terminal, and having a control terminal coupled to said first output terminal;
 a second transistor having a first current terminal coupled to said second current terminal of said first transistor, having a second current terminal coupled to said first output terminal, and having a control terminal coupled to said second output terminal;
 a third transistor having a first current terminal coupled to said first supply node, having a second current terminal, and having a control terminal coupled to said second output terminal; and
 a fourth transistor having a first current terminal coupled to second current terminal of said third transistor, having a second current terminal coupled to said second output terminal, and having a control terminal coupled to said first output terminal.

9. The fully differential amplifier of claim 7, wherein said separator comprises:
 a first transistor having a first current terminal coupled to a first supply node, having a second current terminal, and having a control terminal receiving a bias signal;
 a second transistor having a first current terminal coupled to second current terminal of said first transistor, having a second current terminal, and having a control terminal receiving an activation signal;
 a third transistor having a first current terminal coupled to said second current terminal of said second transistor, having a second current terminal coupled to said second output terminal, and having a control terminal coupled to said first output terminal;
 a fourth transistor having a first current terminal coupled to said second current terminal of said second transistor, having a second current terminal coupled to said first output terminal, and having a control terminal coupled to said second output terminal; and
 wherein said activation signal is asserted to turn on said second transistor when said fully differential amplifier stabilizes after power up.

10. A bidirectional current sense amplifier for measuring a sense current flowing through a sense resistor, comprising:
 first and second sense nodes for coupling across the sense resistor;
 a first gain resistor having a first end coupled to said first sense node and having a second end for coupling to a first differential sense node;
 a second gain resistor having a first end coupled to said second sense node and having a second end for coupling to a second differential sense node;
 a first transistor having current terminals coupled between said first differential sense node and an output node and having a control node coupled to a first differential output node;
 a second transistor having current terminals coupled between said second differential sense node and said output node and having a control node coupled to a second differential output node;
 an output resistor coupled between said output node and a common reference node; and
 an autozeroing fully differential amplifier having first and second input terminals coupled to said first and second differential sense nodes, respectively, and having first and second output terminals coupled to said first and second differential output nodes, respectively, said autozeroing fully differential amplifier comprising:
  first and second dynamically switched current mirrors, each toggling operation between an autozeroing phase in which it mirrors a first current level indicative of a level of said first input terminal to provide a mirrored current, and an output phase in which it applies a difference current to a common output node, wherein said difference current comprises a difference between said mirrored current and a second current level indicative of level of said second input terminal;
  wherein said first and second dynamically switched current mirrors operate out of phase with respect to each other during at least one cycle of a clock signal having a first period and a second period, wherein said first dynamically switched current mirror operates in its autozeroing phase while said second dynamically switched current mirror operates in its output phase during said first period, and wherein said second dynamically switched current mirror operates in its autozeroing phase while said first dynamically switched current mirror operates in its output phase during said second period; and an output circuit which develops a first output signal on said first output terminal at a first polarity based on a level of said common output node, and which develops a second output signal on said second output terminal at a second polarity based on a level of said common output node.

11. The bidirectional current sense amplifier of claim 10, further comprising:
a main differential amplifier having first and second input terminals coupled to said first and second differential sense nodes, respectively, and having first and second output terminals coupled to said first and second differential output nodes, respectively.

12. The bidirectional current sense amplifier of claim 11, further comprising:
first and second supply resistors coupled in series between said first and second differential sense nodes forming an intermediate node comprising a first voltage supply node;
a bypass capacitor coupled between said first voltage supply node and a second voltage supply node;
a bias current source coupled between said second voltage supply node and said common reference node; and
wherein said autozeroing fully differential amplifier and said main differential amplifier each have first and second input supply terminals coupled to said first and second voltage supply nodes, respectively.

13. The bidirectional current sense amplifier of claim 11, further comprising a high frequency filter coupled to said first and second differential sense nodes and said first and second input terminals of said autozeroing differential amplifier.

14. The bidirectional current sense amplifier of claim 12, further comprising:
a filter, comprising:
a first filter resistive device coupled between said first differential sense node and a first filter node;
a second filter resistive device coupled between said first filter node and said first input terminal of said autozeroing fully differential amplifier;
a third filter resistive device coupled between said second input terminal of said autozeroing fully differential amplifier and a second filter node;
a fourth filter resistive device coupled between said second filter node and said second differential sense node;
a first filter capacitive device coupled between said first voltage supply node and said first filter node;
a second filter capacitive device coupled between said first and second input terminals of said autozeroing fully differential amplifier; and
a third filter capacitive device coupled between said first voltage supply node and said second filter node;
a first compensation capacitive device coupled between said first input terminal and said first output terminal of said autozeroing fully differential amplifier;
a second compensation capacitive device coupled between said second input terminal and said second output terminal of said autozeroing fully differential amplifier;

a first decoupling resistive device coupled between said first output terminal of said autozeroing fully differential amplifier and said first output terminal of said main differential amplifier; and
a second decoupling resistive device coupled between said second output terminal of said autozeroing fully differential amplifier and said second output terminal of said main differential amplifier.

15. The bidirectional current sense amplifier of claim 10, further comprising:
an output limiter which limits both of said first and second output terminals of said autozeroing fully differential amplifier when both are active at the same time; and
a separator which causes a more active one of said first and second output terminals autozeroing fully differential amplifier to turn off the other one when a level of said first and second output terminals are relatively close to one another.

16. A method of amplifying a differential input at first and second terminals to provide a differential output at first and second output terminals while automatically zeroing offset voltage, comprising:
during a first period of a first cycle of a clock signal having first and second periods for each cycle:
generating a first current at a level indicative of a level of the first input terminal; and
mirroring the first current as a first mirror current while generating and storing a first charge;
during the second period of the first cycle of the clock signal:
maintaining the first mirror current using the stored first charge;
generating a second current at a level indicative of a level of the second input terminal; and
subtracting the second current from the first mirror current and providing a first difference current to a common node; and
developing a first output signal for the first output terminal at a first polarity based on a level of the common node, and developing a second output signal for the second output terminal at a second polarity based on the level of the common node.

17. The method of claim 16, further comprising:
during the first period of the first cycle of the clock signal:
providing a second mirror current using a stored second charge;
generating a third current at a level indicative of a level of the second input terminal; and
subtracting the third current from the second mirror current and providing a second difference current to the common node; and
during the second period of the first cycle of the clock signal:
generating a fourth current at a level indicative of a level of the first input terminal; and
mirroring the fourth current as a third mirror current while generating and storing a third charge.

18. The method of claim 16, further comprising:
during the second period of the first cycle of the clock signal:
generating a third current at a level indicative of the second input terminal; and
mirroring the third current as a second mirror current while generating and storing a second charge; and
during a first period of a second cycle of the clock signal:
maintaining the second mirror current using the stored second charge;

generating a fourth current at a level indicative of a level of the second input terminal; and subtracting the fourth current from the second mirror current and providing a second difference current to the common node.

19. The method of claim 16, further comprising limiting both of the first and second output terminals when both are active at the same time.

20. The method of claim 16, further comprising separating the first and second output terminals by turning off the less active output terminal when a level of the first and second output terminals are relatively close to each other.

* * * * *